(12) United States Patent
Takami et al.

(10) Patent No.: US 12,532,443 B2
(45) Date of Patent: Jan. 20, 2026

(54) ELECTROMAGNETIC WAVE SHIELD FILM

(71) Applicant: TATSUTA ELECTRIC WIRE & CABLE CO., LTD., Higashiosaka (JP)

(72) Inventors: Kouji Takami, Kizugawa (JP); Kenji Kamino, Kizugawa (JP); Masahiro Watanabe, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 263 days.

(21) Appl. No.: 18/550,985

(22) PCT Filed: Mar. 30, 2022

(86) PCT No.: PCT/JP2022/015761
§ 371 (c)(1),
(2) Date: Sep. 18, 2023

(87) PCT Pub. No.: WO2022/210814
PCT Pub. Date: Oct. 6, 2022

(65) Prior Publication Data
US 2024/0164077 A1 May 16, 2024

(30) Foreign Application Priority Data
Mar. 31, 2021 (JP) .................................. 2021-060395

(51) Int. Cl.
*H05K 9/00* (2006.01)
(52) U.S. Cl.
CPC ................... *H05K 9/0084* (2013.01)
(58) Field of Classification Search
CPC .................................................. H05K 9/0086
See application file for complete search history.

(56) References Cited

U.S. PATENT DOCUMENTS

2015/0009637 A1\* 1/2015 Kawaguchi .......... H05K 1/0216
156/247
2022/0061150 A1\* 2/2022 Aoyagi ................ H05K 9/0064
(Continued)

FOREIGN PATENT DOCUMENTS

JP 2009200113 A 9/2009
JP 2016046405 A 4/2016
(Continued)

OTHER PUBLICATIONS

International Search Report dated Jun. 17, 2022, in connection with International Application PCT/JP2022/015761.
(Continued)

*Primary Examiner* — Hung V Ngo
(74) *Attorney, Agent, or Firm* — RANKIN, HILL & CLARK LLP

(57) ABSTRACT

An electromagnetic wave shielding film includes: a protective layer; a shield layer laminated on the protective layer; and an adhesive layer laminated on the shield layer, a plurality of conductive bumps formed on a side of the adhesive layer of the shield layer, in a plan view of the shield layer from the side of the adhesive layer, the conductive bumps being positioned on a tessellation of two or more kinds of polygons at vertices thereof, with the conductive bumps being arranged such that, with respect to each of them, when drawing line segments connecting the respective conductive bumps and nearest conductive bumps at a nearest position and drawing a straight line passing through one drawn line segment, the straight line has a portion that does not overlap with the other line segments.

9 Claims, 7 Drawing Sheets

(56) References Cited

U.S. PATENT DOCUMENTS

2024/0188267 A1* 6/2024 Takami ................ H05K 9/0084
2025/0133711 A1* 4/2025 Terada ................... H01Q 15/14

FOREIGN PATENT DOCUMENTS

| JP | 2017010995 A | 1/2017 |
|----|--------------|--------|
| WO | 2010082514 A1 | 7/2010 |
| WO | 2018147426 A1 | 8/2018 |
| WO | 2020090727 A1 | 5/2020 |

OTHER PUBLICATIONS

Written Opinion Dated dated Jun. 17, 2022, in connection with International Application PCT/JP2022/015761.

* cited by examiner

ELECTROMAGNETIC WAVE SHIELD FILM

TECHNICAL FIELD

The present invention relates to an electromagnetic wave shielding film.

BACKGROUND ART

Printed wiring boards typified by flexible printed wiring boards are widely used in order to incorporate a circuit into a complicated mechanism in electronic equipment such as mobile phones, video cameras, and notebook personal computers of which sizes are rapidly becoming smaller and functions are rapidly becoming advanced. Furthermore, taking advantage of their superior flexibility, printed wiring boards are also being used to connect a movable unit such as a printer head to a control unit. Measures for shielding electromagnetic waves are essential in such electronic equipment, and even as printed wiring boards to be used inside a device, printed wiring boards with electromagnetic shielding measures (hereinafter, also referred to as "shielded printed wiring boards") such as being adhered with an electromagnetic wave shielding film are becoming more frequently used.

Generally, an electromagnetic wave shielding film is made up of an outermost protective layer, a shield layer for shielding electromagnetic waves, and an adhesive layer for adhering the film to a printed wiring board.

When manufacturing a shielded printed wiring board, an electromagnetic wave shielding film is to be adhered to the printed wiring board so that the adhesive layer of the electromagnetic wave shielding film comes into contact with the printed wiring board.

In addition, a ground circuit of the printed wiring board should be electrically connected to an external ground such as an enclosure. For example, the ground circuit of the printed wiring board may be electrically connected to the external ground via the electromagnetic wave shielding film adhered to the printed wiring board.

Generally, since it is not common practice to design an electromagnetic wave shielding film so as to conform to each individual printed wiring board, an electromagnetic wave shielding film needs to be capable of shielding any kind of a printed wiring board from electromagnetic waves.

This is due to the fact that there are a countless number of configurations such as a shape, wiring, and the like of printed wiring boards and designing an optimal electromagnetic wave shielding film so as to conform to each individual printed wiring board is not realistic in terms of cost-effectiveness.

For example, Patent Literature 1 discloses, as an electromagnetic wave shielding film capable of meeting such requirements, an electromagnetic wave shielding film made up of a protective layer, a shield layer laminated on the protective layer, and an adhesive layer laminated on the shield layer, wherein conductive bumps are formed on a side of the adhesive layer of the shield layer, a volume of each of the conductive bumps ranges from 30,000 to 400,000 $\mu m^3$.

In Patent Literature 1, in order to sufficiently reduce connection resistance between the ground circuit and the shield layer of the printed wiring board, conductive bumps are formed on the shield layer of the electromagnetic wave shielding film and the conductive bumps are brought into contact with the ground circuit of the printed wiring board.

CITATION LIST

Patent Literature

Patent Literature 1: International Publication No. WO 2020/090727

SUMMARY OF INVENTION

Technical Problem

When fabricating a shielded printed wiring board using the electromagnetic wave shielding film described in Patent Literature 1, transmission loss may increase in the shielded printed wiring board.

The present invention has been made in consideration of the problem described above and an object thereof is to provide an electromagnetic wave shielding film capable of reducing transmission loss.

Solution to Problem

The present inventors arrived at the present invention by discovering that, in the electromagnetic wave shielding film according to Patent Literature 1, there are cases where transmission loss increases when conductive bumps are linearly arrayed at regular intervals in a plan view of the electromagnetic wave shielding film.

Specifically, an electromagnetic wave shielding film according to the present invention includes: a protective layer; a shield layer laminated on the protective layer; and an adhesive layer laminated on the shield layer, a plurality of conductive bumps being formed on a side of the adhesive layer of the shield layer, in a plan view of the shield layer from the side of the adhesive layer, the conductive bumps being arranged so as to be positioned on a tessellation of two or more kinds of polygons at vertices of the respective polygons, and the plurality of conductive bumps being arranged such that, with respect to each of the plurality of conductive bumps, when drawing line segments connecting the respective conductive bumps and nearest conductive bumps at a nearest position and drawing a straight line passing through one line segment among the drawn line segments, the straight line having a portion that does not overlap with the other line segments.

The conductive bumps being arrayed in this manner means that, in a plan view of the shield layer from the side of the adhesive layer, adjacent conductive bumps are not linearly arrayed at regular intervals.

The electromagnetic wave shielding film according to the present invention is to be arranged on a printed wiring board.

First, a reason why transmission loss increases when an electromagnetic wave shielding film on which conductive bumps are linearly arrayed at regular intervals is used in a printed wiring board will be described.

Generally, in a printed wiring board, a signal circuit that is separate from a ground circuit is arranged near the ground circuit. When arranging an electromagnetic wave shielding film on the printed wiring board, a conductive bump of the electromagnetic wave shielding film may end up being positioned on such a signal circuit and, accordingly, a parasitic circuit may be generated and transmission loss may increase.

In particular, if conductive bumps are linearly arranged at regular intervals, the number of conductive bumps positioned on a signal circuit increases when an array direction of the conductive bumps and a formation direction of the signal circuit coincide with each other. In this case, a large number of parasitic circuits are generated and transmission loss increases.

In addition, when there are a plurality of signal circuits, the number of parasitic circuits generated between the signal circuits and the conductive bumps may become uneven for each signal circuit. In such a case, transmission loss further increases.

However, in the electromagnetic wave shielding film according to the present invention, since conductive bumps are not linearly arrayed at regular intervals, parasitic circuits can be prevented from being created due to the conductive bumps being positioned on a signal circuit of a printed wiring board and, consequently, transmission loss can be reduced.

In order to prevent a large number of conductive bumps from being arranged on a signal circuit, a method of randomly arranging the conductive bumps is also conceivable. However, randomly arranging the conductive bumps increases the likelihood of creating portions where contact between a conductive bump and a ground circuit is insufficient.

In the electromagnetic wave shielding film according to the present invention, the conductive bumps are arranged so as to be positioned on a tessellation of two or more kinds of polygons at vertices of the respective polygons. In other words, in the electromagnetic wave shielding film according to the present invention, the conductive bumps are regularly arranged in a staggered manner.

When the conductive bumps are regularly arrayed in a staggered manner, the conductive bumps and the ground circuit can be reliably brought into contact with each other.

As a result, connection stability between the shield layer of the electromagnetic wave shielding film and the ground circuit of the printed wiring board can be increased.

In the electromagnetic wave shielding film according to the present invention, the polygons may be two kinds including a rhombus and a regular hexagon, and the rhombus and the regular hexagon may be shaped such that a length of one side of the rhombus and a length of one side of the regular hexagon are equal to each other.

In addition, in the electromagnetic wave shielding film according to the present invention, the polygons may be two kinds including an equilateral triangle and a square, and the equilateral triangle and the square may be shaped such that a length of one side of the equilateral triangle and a length of one side of the square are equal to each other.

In addition, in the electromagnetic wave shielding film according to the present invention, the polygons may be two kinds including an equilateral triangle and a regular hexagon, and the equilateral triangle and the regular hexagon may be shaped such that a length of one side of the equilateral triangle and a length of one side of the regular hexagon are equal to each other.

In addition, in the electromagnetic wave shielding film according to the present invention, the polygons may be three kinds including an equilateral triangle, a square, and a regular hexagon, and the equilateral triangle, the square, and the regular hexagon may be shaped such that a length of one side of the equilateral triangle, a length of one side of the square, and a length of one side of the regular hexagon are equal to each other.

In addition, in the electromagnetic wave shielding film according to the present invention, the polygons may be two kinds including an equilateral triangle and a regular dodecagon, and the equilateral triangle and the regular dodecagon may be shaped such that a length of one side of the equilateral triangle and a length of one side of the regular dodecagon are equal to each other.

In addition, in the electromagnetic wave shielding film according to the present invention, the polygons may be two kinds including a square and a regular octagon, and the square and the regular octagon may be shaped such that a length of one side of the square and a length of one side of the regular octagon are equal to each other.

In addition, in the electromagnetic wave shielding film according to the present invention, the polygons may be three kinds including a square, a regular hexagon, and a regular dodecagon, and the square, the regular hexagon, and the regular dodecagon may be shaped such that a length of one side of the square, a length of one side of the regular hexagon, and a length of one side of the regular dodecagon are equal to each other.

When the polygons assume these shapes, adjacent conductive bumps are not linearly arrayed at regular intervals in a plan view of the shield layer of the electromagnetic wave shielding film according to the present invention from the side of the adhesive layer. Therefore, when using the electromagnetic wave shielding film according to the present invention in a printed wiring board, transmission loss can be reduced.

In addition when the polygons assume these shapes, conductive bumps are to be regularly arranged in a staggered manner in a plan view of the shield layer of the electromagnetic wave shielding film according to the present invention from the side of the adhesive layer.

Generally, from the perspective of work efficiency, it is rare that an electromagnetic wave shielding film is arranged on a printed wiring board in consideration of a relationship between an array direction of conductive bumps arranged on the electromagnetic wave shielding film and a formation direction of a ground circuit of the printed wiring board.

Therefore, in a case where the conductive bumps are only arranged linearly, a direction in which the ground circuit of the printed wiring board is formed and a direction in which the conductive bumps are arrayed may coincide with each other when arranging the electromagnetic wave shielding film on the printed wiring board.

In this case, if the conductive bumps are positioned so as to come into contact with the ground circuit, no problems arise in stability of an electric connection between the shield layer of the electromagnetic wave shielding film and the ground circuit of the printed wiring board. However, when the conductive bumps are positioned so as not to come into contact with the ground circuit, a state is created in which all of the linearly-arranged conductive bumps cannot come into contact with the ground circuit. As a result, a state is created where the shield layer of the electromagnetic wave shielding film and the ground circuit of the printed wiring board cannot be electrically connected to each other via the linearly arranged conductive bumps.

On the other hand, when the conductive bumps are regularly arranged in a staggered manner as in the electromagnetic wave shielding film according to the present invention described above, even if one conductive bump is arranged at a position where the conductive bump cannot come into contact with a ground member, it is highly likely that another conductive bump can come into contact with the ground member. Therefore, the possibility of occurrence of a state where the shield layer of the electromagnetic wave shielding film and the ground circuit of the printed wiring board cannot be electrically connected to each other by the conductive bumps declines.

As a result, connection stability between the shield layer of the electromagnetic wave shielding film and the ground circuit of the printed wiring board can be increased in a shielded printed wiring board to be manufactured.

An electromagnetic wave shielding film according to the present invention includes: a protective layer; a shield layer laminated on the protective layer; and an adhesive layer laminated on the shield layer, a plurality of conductive bumps being formed on a side of the adhesive layer of the shield layer, the plurality of conductive bumps including a first conductive bump and a second conductive bump at a position nearest to the first conductive bump, in a plan view of the shield layer from the side of the adhesive layer, when a straight line "a" passing through the first conductive bump and the second conductive bump is drawn, others of the conductive bumps being arranged on the straight line "a" outside the first conductive bump and the second conductive bump, and when any two of the conductive bumps are selected among the conductive bumps arranged on the straight line "a", when a distance in a case that maximizes a distance between the two selected conductive bumps is denoted by $D_1$ and a distance from the first conductive bump to the second conductive bump is denoted by $D_2$, the number of the conductive bumps arranged on the straight line "a" is less than $D_1/D_2+1$.

The conductive bumps being arrayed in this manner means that, in a plan view of the shield layer from the side of the adhesive layer, adjacent conductive bumps are not linearly arrayed at regular intervals.

In the electromagnetic wave shielding film according to the present invention, since conductive bumps are not linearly arrayed at regular intervals, parasitic circuits can be prevented from being created due to the conductive bumps being positioned on a signal circuit of a printed wiring board and, consequently, transmission loss can be reduced.

Advantageous Effects of Invention

The electromagnetic wave shielding film according to the present invention is to be arranged on a printed wiring board on which a ground circuit is formed. In doing so, conductive bumps of the electromagnetic wave shielding film according to the present invention and the ground circuit of the printed wiring board come into contact with each other.

In the electromagnetic wave shielding film according to the present invention, since adjacent conductive bumps are not linearly arrayed at regular intervals, parasitic circuits can be prevented from being created due to the conductive bumps being positioned on a signal circuit of a printed wiring board and, consequently, transmission loss can be reduced.

DESCRIPTION OF EMBODIMENTS

Hereinafter, an electromagnetic wave shielding film according to the present invention will be described in specific terms. However, it should be noted that the present invention is not limited to the embodiments described below and that the present invention can be appropriately modified and applied without deviating from the gist of the invention.

First Embodiment

An electromagnetic wave shielding film according to a first embodiment of the present invention includes: a protective layer; a shield layer laminated on the protective layer; and an adhesive layer laminated on the shield layer, a plurality of conductive bumps being formed on a side of the adhesive layer of the shield layer, in a plan view of the shield layer from the side of the adhesive layer, the conductive bumps being arranged so as to be positioned on a tessellation of two or more kinds of polygons at vertices of the respective polygons, and the plurality of conductive bumps being arranged such that, with respect to each of the plurality of conductive bumps, when drawing line segments connecting the respective conductive bumps and nearest conductive bumps at a nearest position and drawing a straight line passing through one line segment among the drawn line segments, the straight line having a portion that does not overlap with the other line segments.

As long as the electromagnetic wave shielding film according to the first embodiment of the present invention has the features described above, the electromagnetic wave shielding film can include any other feature insofar as advantageous effects of the invention are produced.

Hereinafter, an example of the electromagnetic wave shielding film according to the first embodiment of the present invention will be described with reference to the drawings.

Figure 1A:
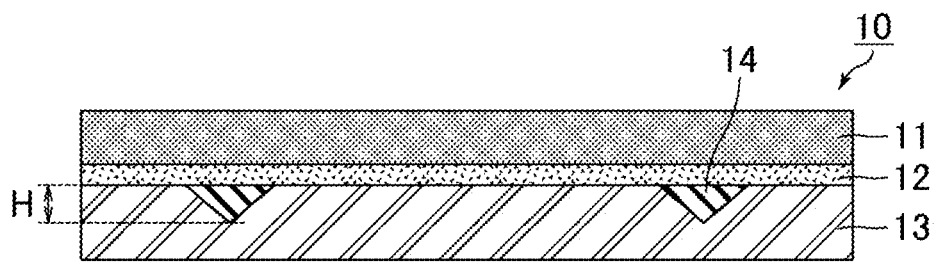
FIG. 1A is a sectional view schematically showing an example of an electromagnetic wave shielding film according to a first embodiment of the present invention.

FIG. 1A is a sectional view schematically showing an example of the electromagnetic wave shielding film according to the first embodiment of the present invention.

As shown in FIG. 1A, an electromagnetic wave shielding film 10 is made up of a protective layer 11, a shield layer 12 laminated on the protective layer 11, and an adhesive layer 13 laminated on the shield layer 12.

The protective layer 11, the shield layer 12, and the adhesive layer 13 are laminated in sequence.

In addition, a plurality of conductive bumps 14 are formed on a side of the adhesive layer 13 of the shield layer 12.

An array of the conductive bumps 14 of the electromagnetic wave shielding film 10 will be described.

Figure 1B:
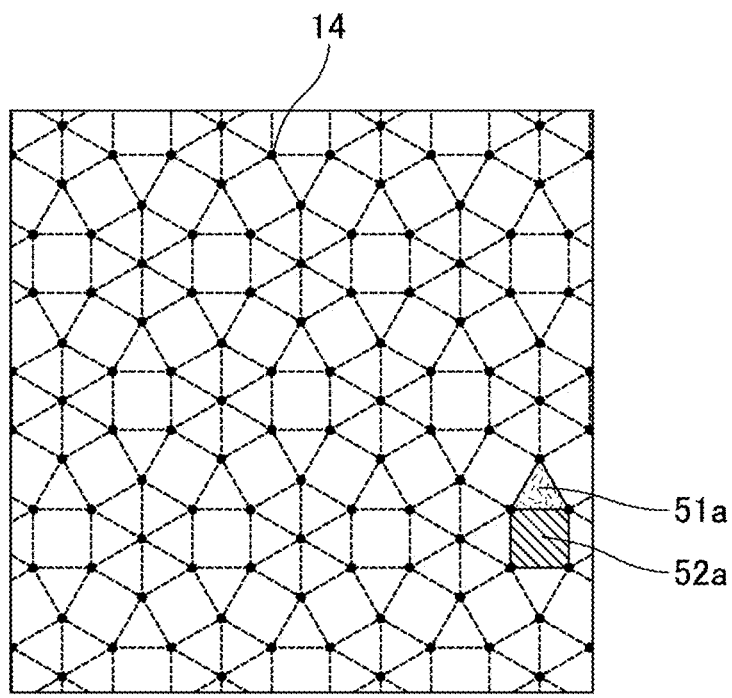
FIG. 1B is a plan view schematically showing an array of conductive bumps in a plan view of a shield layer of the electromagnetic wave shielding film shown in FIG. 1A from a side of an adhesive layer.

FIG. 1B is a plan view schematically showing an array of conductive bumps in a plan view of the shield layer of the electromagnetic wave shielding film shown in FIG. 1A from a side of the adhesive layer.

As shown in FIG. 1B, in the electromagnetic wave shielding film 10, the conductive bumps 14 are arranged on a tessellation of equilateral triangles 51a and squares 52a so as to be positioned at vertices of the respective equilateral triangles 51a and the respective squares 52a. A length of one side of the equilateral triangles 51a and a length of one side of the squares 52a are equal to each other.

While an equilateral triangle denoted by reference sign 51a and a square denoted by reference sign 52a are highlighted and illustrated in FIG. 1B for convenience of description, in the electromagnetic wave shielding film 10, the highlighted and illustrated equilateral triangle 51a and square 52a are no different from other equilateral triangles and squares in terms of structure, functions, and the like.

In the electromagnetic wave shielding film 10, with respect to each of the conductive bumps 14, when drawing a line segment connecting the conductive bump 14 and a nearest conductive bump 14 at a nearest position and drawing a straight line that passes through one line segment among the drawn line segments, the conductive bumps 14 are arranged so that the straight line has a portion that does not overlap with other line segments.

The fact that the conductive bumps 14 are arrayed in this manner will be described in specific terms with reference to the drawings.

Figure 1C:
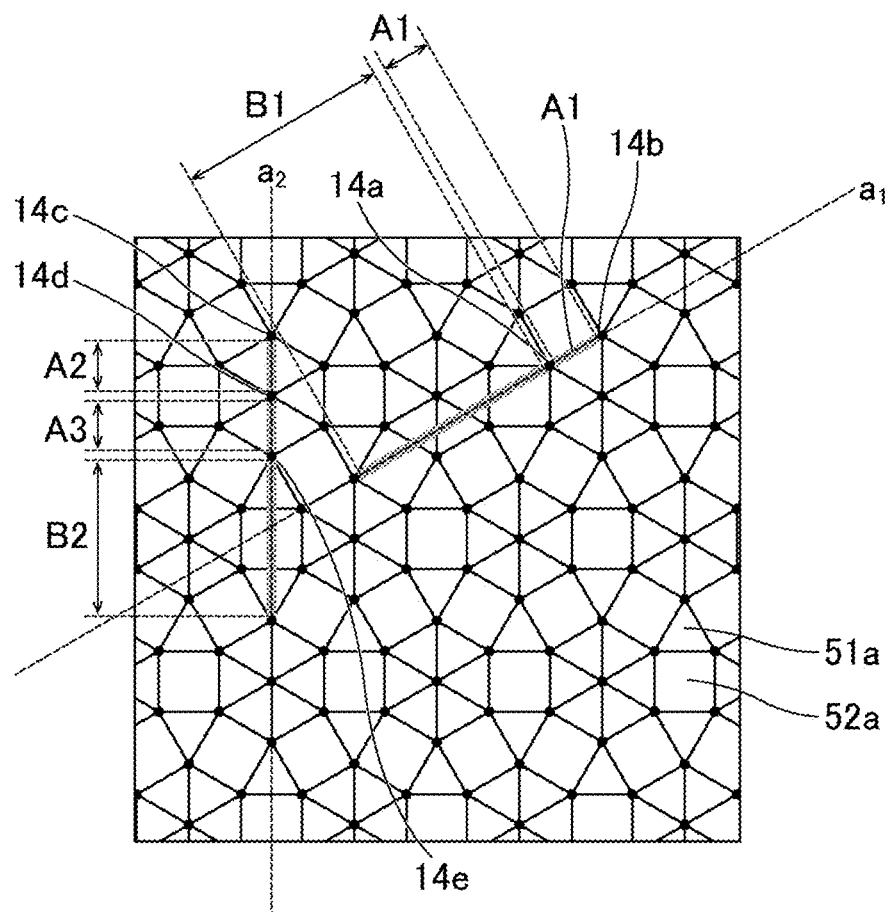
FIG. 1C is a plan view describing that the array of the conductive bumps is characteristic of the present invention in the electromagnetic wave shielding film shown in FIG. 1A and FIG. 1B.

FIG. 1C is a plan view describing that the array of the conductive bumps is characteristic of the present invention in the electromagnetic wave shielding film shown in FIG. 1A and FIG. 1B.

As shown in FIG. 1C, first, a line segment connecting each conductive bump 14 and a nearest conductive bump 14 at a nearest position (a line segment indicated by a solid line connecting conductive bumps 14 in FIG. 1C) is drawn.

In the electromagnetic wave shielding film 10, when drawing a straight line passing through one line segment, respective line segments may be positioned on the straight line while being separated from each other or a part of the line segments may be continuously positioned on the straight line if the straight line has a portion that does not overlap with other line segments.

First, a case where the respective line segments are positioned on the straight line while being separated from each other will be described.

In FIG. 1C, let us focus on a conductive bump 14a and a conductive bump 14b among the conductive bumps 14. The conductive bump 14a is a nearest conductive bump at a nearest position to the conductive bump 14b. The conductive bump 14a and the conductive bump 14b are connected by a line segment A1.

When a straight line $a_1$ passing through the line segment A1 is drawn, a section where a distance between the conductive bumps 14 is not minimized (in FIG. 1C, a line segment denoted by reference sign B1) is created on the straight line $a_1$. In other words, the straight line $a_1$ has a portion that does not overlap with a line segment that connects each conductive bump and a nearest conductive bump at a nearest position to each other.

In addition, on the straight line $a_1$, line segments that connect the respective conductive bumps and nearest conductive bumps at nearest positions to each other are not continuous and are separated from each other.

Next, a case where a part of the line segments are continuously positioned on the straight line will be described.

In FIG. 1C, let us focus on a conductive bump 14c, a conductive bump 14d, and a conductive bump 14e among the conductive bumps 14.

The conductive bump 14c is a nearest conductive bump at a nearest position to the conductive bump 14d. The conductive bump 14d is a nearest conductive bump at a nearest position to the conductive bump 14e.

The conductive bump 14c and the conductive bump 14d are connected by a line segment A2. In addition, the conductive bump 14d and the conductive bump 14e are connected by a line segment A3.

The conductive bump 14c, the conductive bump 14d, and the conductive bump 14e are arranged on a straight line.

When a straight line $a_2$ passing through the conductive bump 14c, the conductive bump 14d, and the conductive bump 14e is drawn, a section where a distance between the conductive bumps 14 is not minimized (in FIG. 1C, a line segment denoted by reference sign B2) is created. In other words, on the straight line $a_2$, a part of the line segments (in other words, the line segment A2 and the line segment A3) are continuous and overlap with each other. However, the straight line $a_2$ has a portion that does not overlap with line segments that connect respective conductive bumps and nearest conductive bumps at a nearest position to each other.

From the above, the electromagnetic wave shielding film 10 can be described such that, with respect to the conductive bumps 14, when drawing line segments connecting the conductive bumps 14 and nearest conductive bumps 14 at a nearest position and drawing a straight line passing through one line segment among the drawn line segments, the conductive bumps 14 are arranged so that the straight line has a portion that does not overlap with other line segments.

The conductive bumps 14 being arrayed in this manner means that, in a plan view of the shield layer 12 from the side of the adhesive layer 13, adjacent conductive bumps 14 are not linearly arrayed at regular intervals but are regularly arranged in a staggered manner.

The electromagnetic wave shielding film 10 is arranged on the printed wiring board and exhibits advantageous effects when becoming a part of constituent elements of a shielded printed wiring board.

In consideration thereof, a shielded printed wiring board including the electromagnetic wave shielding film 10 will be described.

Figure 2:
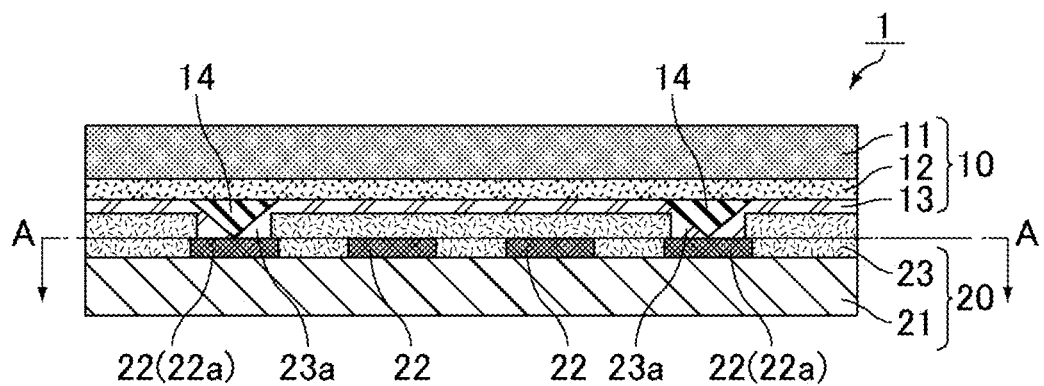
FIG. 2 is a sectional view schematically showing an example of a shielded printed wiring board in which the electromagnetic wave shielding film according to the first embodiment of the present invention is used.

FIG. 2 is a sectional view schematically showing an example of a shielded printed wiring board in which the electromagnetic wave shielding film according to the first embodiment of the present invention is used.

As shown in FIG. 2, a shielded printed wiring board 1 includes a base film 21, a printed circuit 22 including a plurality of ground circuits 22a formed on the base film 21, and a coverlay 23 that covers the printed circuit 22. The coverlay 23 includes, as constituent elements, a printed wiring board 20 on which an opening portion 23a that exposes the ground circuits 22a is formed and the electromagnetic wave shielding film 10 arranged on the printed wiring board 20.

In the shielded printed wiring board 1, the conductive bumps 14 of the electromagnetic wave shielding film 10 penetrate the adhesive layer 13 and are in contact with the ground circuits 22a of the printed wiring board 20.

A reason why transmission loss increases when an electromagnetic wave shielding film on which conductive bumps are linearly arrayed at regular intervals is used in a printed wiring board will now be described.

Generally, in a printed wiring board, a signal circuit that is separate from a ground circuit is arranged near the ground circuit. When arranging an electromagnetic wave shielding film on the printed wiring board, a conductive bump of the electromagnetic wave shielding film may end up being positioned on such a signal circuit and, accordingly, a parasitic circuit may be generated and transmission loss may increase.

In particular, if conductive bumps are linearly arranged at regular intervals, the number of conductive bumps positioned on a signal circuit increases when an array direction of the conductive bumps and a formation direction of the signal circuit coincide with each other. In this case, a large number of parasitic circuits are generated and transmission loss increases.

In addition, when there are a plurality of signal circuits, the number of parasitic circuits generated between the signal circuits and the conductive bumps may become uneven for each signal circuit. In such a case, transmission loss further increases.

However, in the electromagnetic wave shielding film 10, since the conductive bumps 14 are not linearly arrayed at regular intervals, parasitic circuits can be prevented from being created due to the conductive bumps 14 being positioned on a signal circuit of the printed wiring board 20 and, consequently, transmission loss can be reduced.

Next, a positional relationship between the conductive bumps 14 and the ground circuits 22a will be described.

Figure 3:
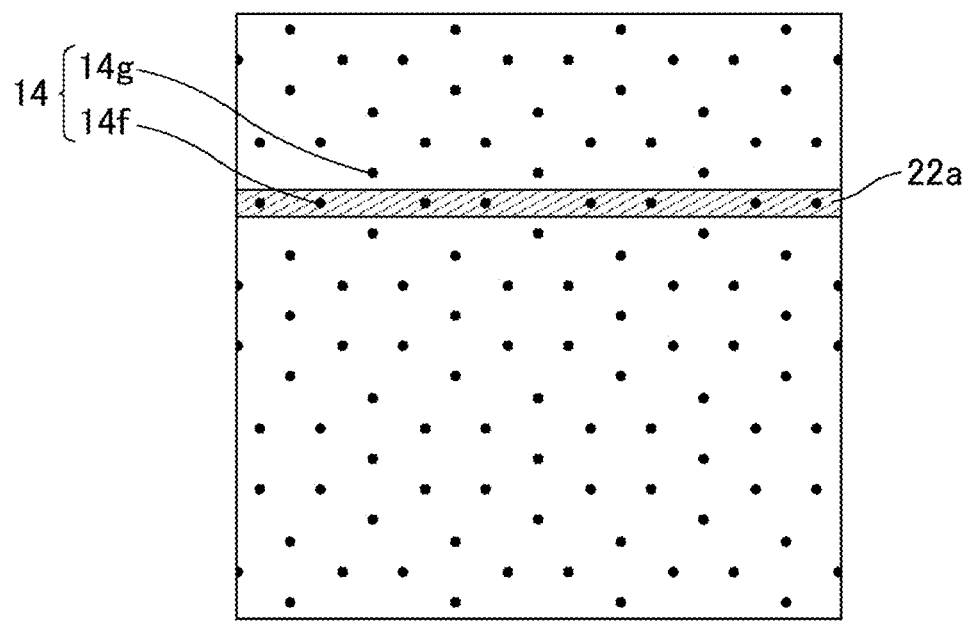
FIG. 3 is a sectional view taken along line A-A in FIG. 2.

FIG. 3 is a sectional view taken along line A-A in FIG. 2. Note that FIG. 3 only shows one ground circuit 22a for convenience of description.

As shown in FIG. 3, the ground circuit 22a is formed in a linear shape.

In addition, as shown in FIG. 3, when the conductive bumps 14 of the electromagnetic wave shielding film 10 are regularly arranged in a staggered manner, the conductive bumps 14 and the ground circuit 22a can be reliably brought into contact with each other. In other words, even when a conductive bump 14g is arranged at a position where the conductive bump 14g cannot come into contact with the ground circuit 22a, a conductive bump 14f can come into contact with the ground circuit 22a.

Therefore, connection stability between the shield layer 12 of the electromagnetic wave shielding film 10 and the ground circuits 22a of the printed wiring board 20 can be increased in the shielded printed wiring board 1.

A problem arising from a positional relationship between conductive bumps and ground circuits when the conductive bumps are linearly arrayed at regular intervals in an electromagnetic wave shielding film will now be described.

Figure 4:
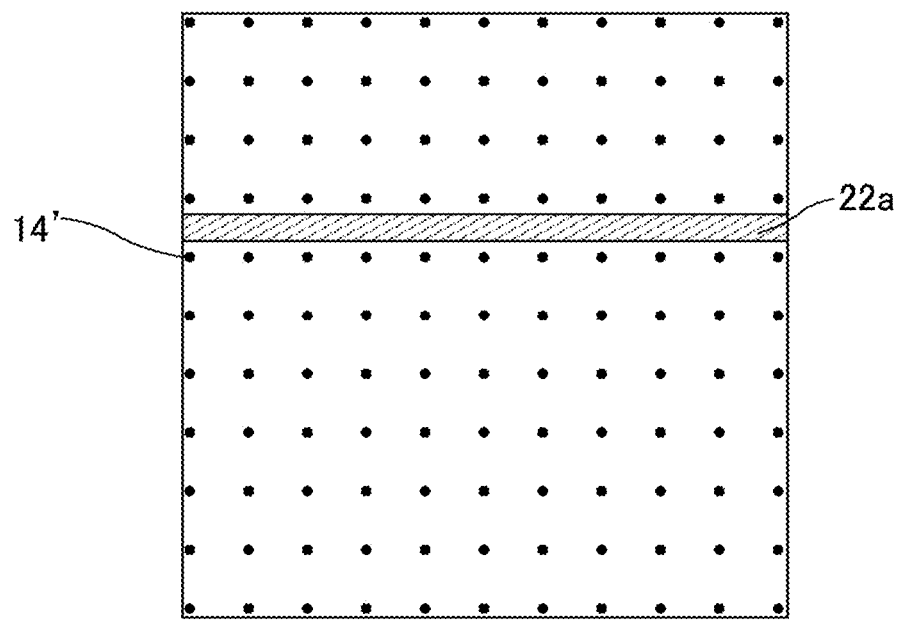
FIG. 4 is a plan view schematically showing an example of a positional relationship between conductive bumps and a ground circuit in a shielded printed wiring board including an electromagnetic wave shielding film in which conductive bumps are linearly arrayed at regular intervals.

FIG. 4 is a plan view schematically showing an example of a positional relationship between conductive bumps and a ground circuit in a shielded printed wiring board including an electromagnetic wave shielding film in which conductive bumps are linearly arrayed at regular intervals.

As shown in FIG. 4, when conductive bumps 14' are only linearly arranged, when a direction in which the ground circuit 22a is formed and an array direction of the conductive bumps 14' coincide with each other and the conductive bumps 14' are positioned so as not to come into contact with the ground circuit 22a, a state is created in which all of the linearly-arranged conductive bumps 14' cannot come into contact with the ground circuit 22a. Such a situation is particularly likely to occur when a width of the ground circuit 22a is narrow. As a result, a state is created where the shield layer of the electromagnetic wave shielding film and the ground circuit 22a of the printed wiring board cannot be electrically connected to each other via the linearly arranged conductive bumps 14'.

However, as described above, such a problem is less likely to occur in the shielded printed wiring board 1 using the electromagnetic wave shielding film 10.

Next, a preferable aspect of each component of the electromagnetic wave shielding film 10 will be described.

(Protective Layer)

While a material of the protective layer 11 is not limited, the protective layer 11 is preferably constituted of a thermoplastic resin composition, a thermoset resin composition, an active energy ray-curable composition, or the like.

Examples of the thermoplastic resin composition include, but are not limited to, a styrene resin composition, a vinyl acetate resin composition, a polyester resin composition, a polyethylene resin composition, a polypropylene resin composition, an imide resin composition, and an acrylic resin composition.

Examples of the thermoset resin composition include, but are not limited to, at least one resin composition selected from the group consisting of an epoxy resin composition, a urethane resin composition, a urethane urea resin composition, a styrene resin composition, a phenolic resin composition, a melamine resin composition, an acrylic resin composition, and an alkyd resin composition.

Examples of the active energy ray-curable composition include, but are not limited to, a polymerizable compound having at least two (meth)acryloyloxy groups in one molecule.

The protective layer 11 may be constituted of a single independent material or two or more materials.

The protective layer 11 may include, as necessary, a hardening accelerator, a tackifier, an antioxidant, a pigment, a dye, a plasticizer, an ultraviolet absorber, an antifoam agent, a leveling agent, a filler, a flame retardant, a viscosity modifier, or an antiblocking agent.

While a thickness of the protective layer 11 is not limited and can be appropriately set as necessary, the thickness preferably ranges from 1 to 15 μm and more preferably ranges from 3 to 10 μm.

When the thickness of the protective layer is less than 1 μm, it is difficult for the excessively thin protective layer to sufficiently protect the shield layer and the adhesive layer.

When the thickness of the protective layer exceeds 15 μm, the excessively thick protective layer can no longer readily bend and the protective layer itself becomes susceptible to damage. This makes the protective layer less applicable to a member that requires bending resistance.

(Shield Layer)

A material of the shield layer 12 is not limited as long as the shield layer 12 is capable of shielding electromagnetic waves and, for example, the shield layer 12 may be made of a metal or made of a conductive resin.

When the shield layer 12 is made of a metal, examples of the metal include gold, silver, copper, aluminum, nickel, tin, palladium, chromium, titanium, and zinc. Among these metals, copper is preferably used. Copper is a preferred material as the shield layer from the perspectives of conductivity and economic efficiency.

Note that the shield layer 12 may be made of an alloy of the metals described above.

In addition, the shield layer 12 may be a metal foil or a metal film formed by a method such as sputtering, electroless plating, or electrolytic plating.

When the shield layer 12 is made of a conductive resin, the shield layer 12 may be constituted of conducting particles and a resin.

The conducting particles may be, although not limited to, metal microparticles, a carbon nanotube, carbon fibers, metallic fibers, or the like.

When the conducting particles are metal microparticles, the metal microparticles may be, although not limited to, silver powder, copper powder, nickel powder, solder powder, aluminum powder, silver-coated copper powder created by subjecting copper powder to silver plating, or fine particles created by coating polymeric microparticles, glass beads, and the like with a metal.

Among these materials, inexpensively available copper powder or silver-coated copper powder is preferable from the perspective of economic efficiency.

While an average particle diameter $D_{50}$ of the conducting particles is not limited, the average particle diameter $D_{50}$ preferably ranges from 0.5 to 15.0 μm. An average particle diameter of the conducting particles of 0.5 μm or more results in favorable conductivity of the conducting resin. An average particle diameter of the conducting particles of 15.0 μm or less enables a conductive resin to be made thin.

While a shape of the conducting particles is not limited, the shape can be appropriately selected from a spherical shape, a flat shape, a scale-like shape, a dendrite shape, a rod shape, a fibrous shape, and the like.

While a blending amount of the conducting particles is not limited, the blending amount preferably ranges from 15 to 80 percent by mass and more preferably ranges from 15 to 60 percent by mass.

While the resin is not limited, examples of the resin include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition and thermoset resin compositions such as phenolic resin composition, epoxy resin composition, urethane resin composition, melamine resin composition, and an alkyd resin composition.

(Conductive Bump)

The conductive bumps 14 are to penetrate the adhesive layer 13 and come into contact with the ground circuits 22a.

While a shape of the conductive bumps 14 is not limited, the shape may be a columnar shape such as a circular cylinder, a triangular prism, or a square prism or a conical shape such as a circular cone, a triangular pyramid, or a square pyramid.

Among these shapes, a conical shape is preferable.

When the shape of the conductive bumps 14 is a conical shape, the conductive bumps 14 more readily penetrate the adhesive layer 13 and more readily come into contact with the ground circuit 22a.

A volume per one conductive bump 14 preferably ranges from 30,000 to 400,000 μm$^3$ and more preferably ranges from 50,000 to 400,000 μm$^3$.

When the volume per one conductive bump 14 is in the ranges described above, the conductive bumps 14 can come into contact with the ground circuits 22a in a reliable manner.

When the volume per one conductive bump is less than 30,000 μm$^3$, the conductive bumps are less likely to come into contact with the ground circuit and connection resistance between the ground circuits and the shield layer is likely to increase.

When the volume per one conductive bump exceeds 400,000 μm$^3$, a ratio of the conductive bumps in the adhesive layer increases.

As a result, a relative permittivity and a dielectric dissipation factor of an entire region where the adhesive layer is present are likely to increase. Therefore transmission characteristics are likely to deteriorate.

A height of the plurality of conductive bumps 14 (a height denoted by reference sign "H" in FIG. 1A) is preferably approximately the same.

When the height of the plurality of conductive bumps 14 is approximately the same, the plurality of conductive bumps 14 uniformly penetrate the adhesive layer 13 and more readily come into contact with the ground circuits 22a.

The height of the conductive bumps 14 preferably ranges from 1 to 50 μm and more preferably ranges from 5 to 30 μm.

Note that the shape, the height, and the volume of the conductive bumps can be analyzed by measuring any five points on a surface of a shield layer on which conductive bumps have been formed using a confocal microscope (OPTELICS HYBRID manufactured by Lasertec Corporation, with 20× objective lens) and subsequently using data analysis software (LMeye7). With height as a binarization parameter, Kittler's method can be used as an automatic threshold algorithm.

The conductive bumps 14 are preferably made of a resin composition and a conductive filler.

In other words, the conductive bumps 14 may be made of a conductive paste.

Using a conductive paste enables the conductive bumps 14 to be readily formed at any position and in any shape.

In addition, the conductive bumps 14 may be formed by screen printing.

When forming the conductive bumps 14 by screen printing using a conductive paste, the conductive bumps 14 can be readily and efficiently formed at any position and in any shape.

When the conductive bumps 14 are made up of a resin composition and a conductive filler, while the resin composition is not limited, examples of a resin composition that can be used include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition and thermoset resin compositions such as phenolic resin composition, epoxy resin composition, urethane resin composition, melamine resin composition, and an alkyd resin composition.

A material of the resin composition may be one independent material or a combination of two or more materials among the materials described above.

When the conductive bumps 14 are made up of a resin composition and a conductive filler, while the conductive filler is not limited, the conductive filler may be metal microparticles, a carbon nanotube, carbon fibers, metallic fibers, or the like.

When the conductive filler is metal microparticles, the metal microparticles may be, although not limited to, silver powder, copper powder, nickel powder, solder powder, aluminum powder, silver-coated copper powder created by subjecting copper powder to silver plating, or fine particles created by coating polymeric microparticles, glass beads, and the like with a metal.

Among these materials, inexpensively available copper powder or silver-coated copper powder is preferable from the perspective of economic efficiency.

While an average particle diameter $D_{50}$ of the conductive filler is not limited, the average particle diameter $D_{50}$ preferably ranges from 0.5 to 15.0 μm.

While a shape of the conductive filler is not limited, the shape can be appropriately selected from a spherical shape, a flat shape, a scale-like shape, a dendrite shape, a rod shape, a fibrous shape, and the like.

When the conductive bumps 14 are made up of a resin composition and a conductive filler, a weight ratio of the conductive filler preferably ranges from 30 to 99% and more preferably ranges from 50 to 99%.

In addition, the conductive bumps 14 may be made of a metal formed by a plating method, a vapor deposition method, or the like.

In this case, the conductive bumps are preferably made of copper, silver, tin, gold, palladium, aluminum, chromium, titanium, zinc, and an alloy including any one or more of these metals.

Conventional methods can be used as the plating method or the vapor deposition method.

(Adhesive Layer)

As described above, the electromagnetic wave shielding film 10 is to be pasted to the printed wiring board 20 by the adhesive layer 13.

In the electromagnetic wave shielding film 10, a surface on an opposite side of a surface that comes into contact with the shield layer 12 of the adhesive layer 13 is preferably flat.

When the surface is flat, the plurality of conductive bumps 14 are to uniformly penetrate the adhesive layer 13.

Therefore, the plurality of conductive bumps 14 are to uniformly come into contact with the plurality of ground circuits 22a.

In the electromagnetic wave shielding film 10, a thickness of the adhesive layer 13 preferably ranges from 5 to 30 μm and more preferably ranges from 8 to 20 μm.

When the thickness of the adhesive layer is less than 5 μm, since an amount of resin that constitutes the adhesive layer is small, sufficient adhesive performance is less likely to be obtained. In addition, the adhesive layer becomes more susceptible to damage.

When the thickness of the adhesive layer exceeds 30 μm, the adhesive layer becomes thick as a whole and flexibility may decline. In addition, the conductive bumps become less capable of penetrating the adhesive layer.

In the electromagnetic wave shielding film 10, relative permittivity of the resin constituting the adhesive layer 13 at a frequency of 1 GHz and a temperature of 23° C. preferably ranges from 1 to 5 and more preferably ranges from 2 to 4.

In addition, a dielectric dissipation factor of the resin constituting the adhesive layer 13 at a frequency of 1 GHz and a temperature of 23° C. preferably ranges from 0.0001 to 0.03 and more preferably ranges from 0.001 to 0.002.

When the resin is within these ranges, transmission characteristics of the shielded printed wiring board 1 to be manufactured using the electromagnetic wave shielding film 10 can be improved.

While the adhesive layer 13 in the electromagnetic wave shielding film 10 may be a conductive adhesive layer or an insulating adhesive layer, from the perspective of lowering relative permittivity and a dielectric dissipation factor, the adhesive layer 13 is preferably an insulating adhesive layer.

As described above, the electromagnetic wave shielding film 10 is to be pasted to the printed wiring board 20 by the adhesive layer 13.

When the adhesive layer 13 is an insulating adhesive layer, since the adhesive layer 13 does not contain conductive substances such as a conductive filler, relative permittivity and a dielectric dissipation factor can be made sufficiently small. In this case, with the shielded printed wiring board 1 manufactured using the electromagnetic wave shielding film 10, favorable transmission characteristics are attained.

When the adhesive layer 13 has conductivity, the adhesive layer 13 is to contain conductive substances such as a conductive filler. When the adhesive layer 13 contains such conductive substances at a large content, relative permittivity and a dielectric dissipation factor of the entire adhesive layer 13 are likely to increase.

On the other hand, in order to obtain favorable transmission characteristics of the manufactured shielded printed wiring board 1, the entire adhesive layer 13 preferably has lower relative permittivity and a lower dielectric dissipation factor.

Therefore, even when the adhesive layer 13 contains conductive substances, the smaller a content of the conductive substances, the better to lower the relative permittivity and the dielectric dissipation factor of the entire adhesive layer 13.

The adhesive layer 13 may be made of a thermoset resin composition or a thermoplastic resin composition.

Examples of the thermoset resin composition include a phenolic resin composition, an epoxy resin composition, a urethane resin composition, a melamine resin composition, a polyamide resin composition, and an alkyd resin composition.

In addition, examples of the thermoplastic resin composition include a styrene resin composition, a vinyl acetate resin composition, a polyester resin composition, a polyethylene resin composition, a polypropylene resin composition, an imide resin composition, and an acrylic resin composition.

Furthermore, as an epoxy resin composition, an amide-modified epoxy resin composition is more preferable.

These resin compositions are suitable as a resin that constitutes the adhesive layer.

A material of the adhesive layer may be one independent material or a combination of two or more materials among the materials described above.

Next, a preferable aspect of each component of the printed wiring board 20 will be described.

(Base Film and Coverlay)

While materials of the base film 21 and the coverlay 23 are not limited, the base film 21 and the coverlay 23 are favorably made of engineering plastic. Examples of the engineering plastic include resins such as polyethylene terephthalate, polypropylene, cross-linked polyethylene, polyester, polybenzimidazole, polyimide, polyimide amide, polyetherimide, and polyphenylene sulfide.

In addition, among these engineering plastics, a polyphenylene sulfide film is preferable when flame retardancy is required and a polyimide film is preferable when heat resistance is required. A thickness of the base film 21 preferably ranges from 10 to 40 μm and a thickness of the coverlay 23 preferably ranges from 10 to 30 μm.

While a size of the opening portion 23a is not limited, the size of the opening portion 23a is preferably 0.1 mm$^2$ or more and more preferably 0.3 mm$^2$ or more.

In addition, a shape of the opening portion 23a is not limited and may be a circular shape, an elliptical shape, a square shape, a triangular shape, or the like.

(Printed Circuit)

The materials of the printed circuit 22 and the ground circuits 22a are not limited and may be a copper foil, a hardened material of a conductive paste, or the like.

Next, another arrangement of the conductive bumps in the electromagnetic wave shielding film according to the first embodiment of the present invention will be described.

As described above, in the electromagnetic wave shielding film 10, the conductive bumps 14 are arranged on a tessellation of equilateral triangles 51a and squares 52a so as to be positioned at vertices of the respective equilateral triangles 51a and the respective squares 52a. However, in the electromagnetic wave shielding film according to the first embodiment of the present invention, for example, the arrangement of the conductive bumps may be the arrangements shown in FIGS. 5A to 5F described below.

FIGS. 5A to 5F are plan views schematically showing an example of an array of conductive bumps in a plan view of the shield layer of the electromagnetic wave shielding film according to the first embodiment of the present invention from a side of the adhesive layer.

While some polygons are highlighted and illustrated in FIGS. 5A to 5F for convenience of description, in the electromagnetic wave shielding film according to the present invention, the highlighted and illustrated polygons are no different from other polygons in terms of structure, functions, and the like.

Figure 5A:
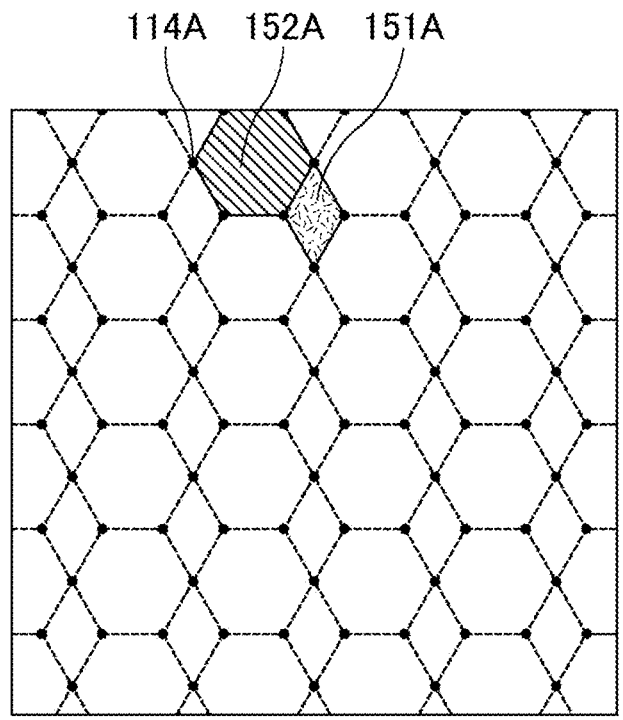
FIG. 5A is a plan view schematically showing an example of an array of conductive bumps in a plan view of the shield layer of the electromagnetic wave shielding film according to the first embodiment of the present invention from a side of the adhesive layer.

As shown in FIG. 5A, the polygons to be tessellated may be two kinds including a rhombus 151A and a regular hexagon 152A, and a length of one side of the rhombus 151A and a length of one side of the regular hexagon 152A may be equal to each other.

In addition, conductive bumps 114A are arranged so as to be positioned on vertices of the rhombuses 151A and the regular hexagons 152A.

Figure 5B:
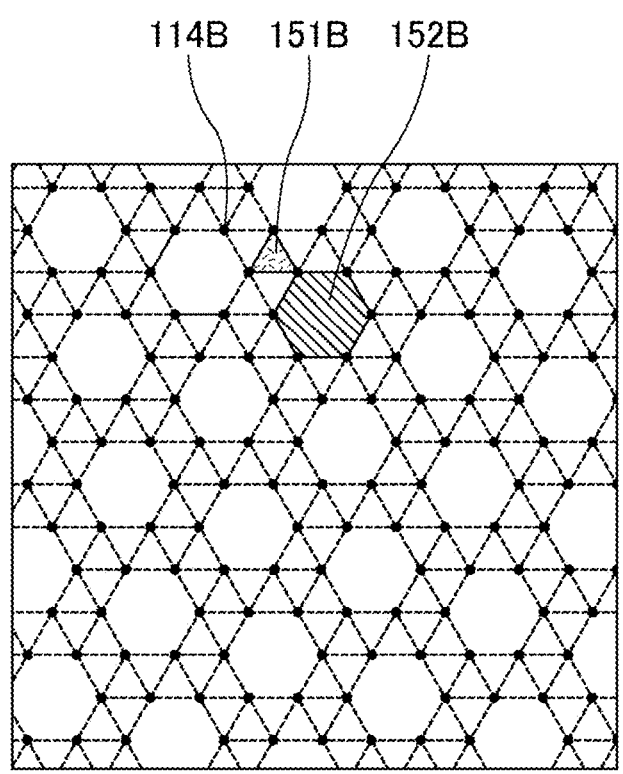
FIG. 5B is a plan view schematically showing an example of an array of conductive bumps in a plan view of the shield layer of the electromagnetic wave shielding film according to the first embodiment of the present invention from a side of the adhesive layer.

As shown in FIG. 5B, the polygons to be tessellated may be two kinds including an equilateral triangle 151B and a regular hexagon 152B, and a length of one side of the equilateral triangle 151B and a length of one side of the regular hexagon 152B may be equal to each other.

In addition, conductive bumps 114B are arranged so as to be positioned on vertices of the equilateral triangles 151B and the regular hexagons 152B.

Figure 5C:
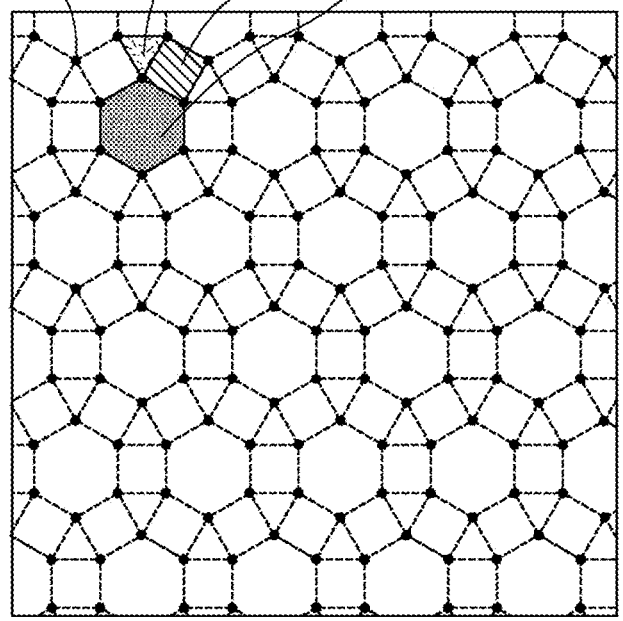
FIG. 5C is a plan view schematically showing an example of an array of conductive bumps in a plan view of the shield layer of the electromagnetic wave shielding film according to the first embodiment of the present invention from a side of the adhesive layer.

As shown in FIG. 5C, the polygons to be tessellated may be three kinds including an equilateral triangle 151C, a square 152C, and a regular hexagon 153C, and a length of one side of the equilateral triangle 151C, a length of one side of the square 152C, and a length of one side of the regular hexagon 153C may be equal to each other.

In addition, conductive bumps 114C are arranged so as to be positioned on vertices of the equilateral triangles 151C, the squares 152C, and the regular hexagons 153C.

Figure 5D:
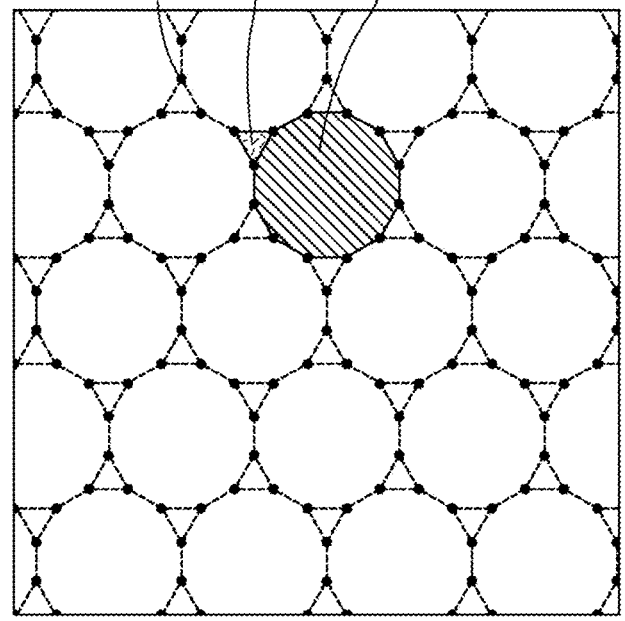
FIG. 5D is a plan view schematically showing an example of an array of conductive bumps in a plan view of the shield layer of the electromagnetic wave shielding film according to the first embodiment of the present invention from a side of the adhesive layer.

As shown in FIG. 5D, the polygons to be tessellated may be two kinds including an equilateral triangle 151D and a regular dodecagon 152D, and a length of one side of the equilateral triangle 151D and a length of one side of the regular dodecagon 152D may be equal to each other.

In addition, conductive bumps 114D are arranged so as to be positioned on vertices of the equilateral triangles 151D and the regular dodecagons 152D.

Figure 5E:
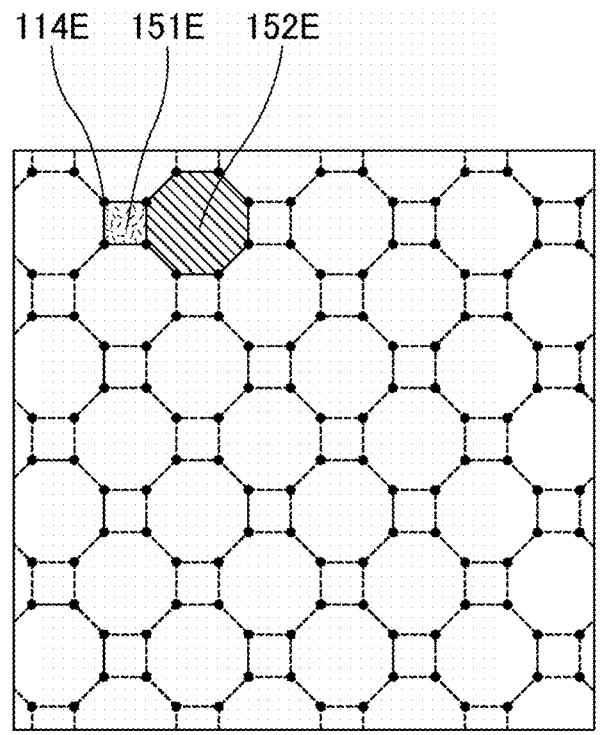
FIG. 5E is a plan view schematically showing an example of an array of conductive bumps in a plan view of the shield layer of the electromagnetic wave shielding film according to the first embodiment of the present invention from a side of the adhesive layer.

As shown in FIG. 5E, the polygons to be tessellated may be two kinds including a square 151E and a regular octagon 152E, and a length of one side of the square 151E and a length of one side of the regular octagon 152E may be equal to each other.

In addition, conductive bumps 114E are arranged so as to be positioned on vertices of the squares 151E and the regular octagons 152E.

Figure 5F:
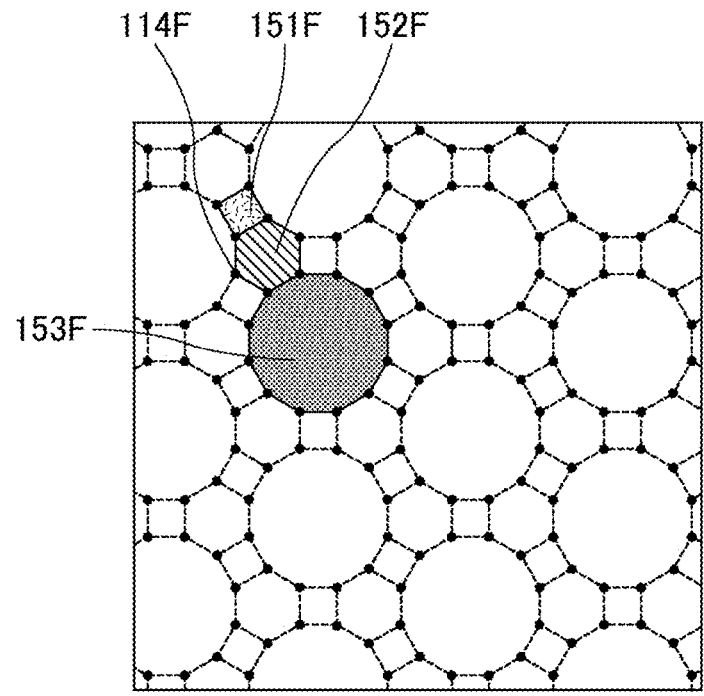
FIG. 5F is a plan view schematically showing an example of an array of conductive bumps in a plan view of the shield layer of the electromagnetic wave shielding film according to the first embodiment of the present invention from a side of the adhesive layer.

As shown in FIG. 5F, the polygons to be tessellated may be three kinds including a square 151F, a regular hexagon 152F, and a regular dodecagon 153F, and a length of one side of the square 151F, a length of one side of the regular hexagon 152F, and a length of one side of the regular dodecagon 153F may be equal to each other.

In addition, conductive bumps 114F are arranged so as to be positioned on vertices of the squares 151F, the regular hexagons 152F, and the regular dodecagons 153F.

By arranging, on a printed wiring board, the electromagnetic wave shielding films in which the conductive bumps 114A to 114F are arranged as described above, parasitic circuits can be prevented from being created due to the conductive bumps being positioned on a signal circuit of the printed wiring board and, consequently, transmission loss can be reduced.

The conductive bumps described heretofore are arranged so as to be positioned on a tessellation of two or more kinds of regular polygons at vertices of the respective regular polygons.

However, in the electromagnetic wave shielding film according to the first embodiment of the present invention, arrangements of the conductive bumps are not limited to the arrays described above as long as the conductive bumps are arranged so as to be positioned on a tessellation of two or more kinds of polygons at vertices of the respective polygons and, with respect to each of the conductive bumps, when drawing line segments connecting the respective conductive bumps and nearest conductive bumps at a nearest position and drawing a straight line passing through one line segment among the drawn line segments, the conductive bumps are arranged so that the straight line has a portion that does not overlap with other line segments.

The polygons to be tessellated may be a convex polygon and a non-convex polygon that are not regular polygons.

Second Embodiment

Next, an electromagnetic wave shielding film according to a second embodiment of the present invention will be described.

The electromagnetic wave shielding film according to the second embodiment of the present invention includes: a protective layer; a shield layer laminated on the protective layer; and an adhesive layer laminated on the shield layer, a plurality of conductive bumps being formed on a side of the adhesive layer of the shield layer, the plurality of conductive bumps including a first conductive bump and a second conductive bump at a position nearest to the first conductive bump, in a plan view of the shield layer from the side of the adhesive layer, other conductive bumps being arranged on a straight line "a" connecting the first conductive bump and the second conductive bump to each other, and with respect to the conductive bumps arranged on the straight line "a", when a distance between conductive bumps that are most separated from each other is denoted by $D_1$ and a distance from the first conductive bump to the second conductive bump is denoted by $D_2$, the number of the conductive bumps arranged on the straight line "a" being less than $D_1/D_2+1$.

As long as the electromagnetic wave shielding film according to the second embodiment of the present invention has the features described above, the electromagnetic wave shielding film can include any other feature insofar as advantageous effects of the invention are produced.

More specifically, "with respect to the conductive bumps arranged on the straight line "a", when a distance between conductive bumps that are most separated from each other is denoted by $D_1$" refers to the following distance.

First, positions of intersections where the straight line "a" and ends of the shield layer intersect with each other are determined. A conductive bump positioned on the straight line "a" and arranged at a position nearest to one of the intersections and a conductive bump positioned on the straight line "a" and arranged at a position nearest to the other intersection are selected. A distance between the selected conductive bumps is the distance $D_1$.

Figure 6A:
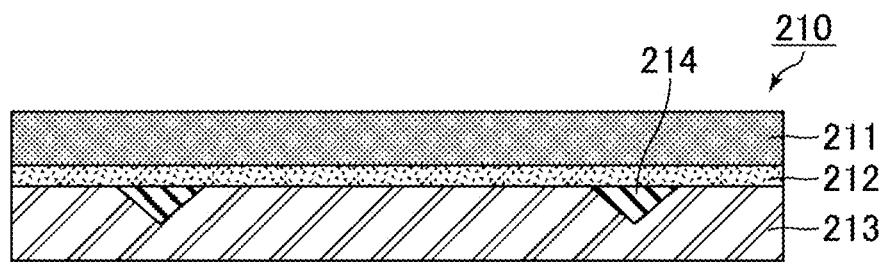
FIG. 6A is a sectional view schematically showing an example of an electromagnetic wave shielding film according to a second embodiment of the present invention.

FIG. 6A is a sectional view schematically showing an example of the electromagnetic wave shielding film according to the second embodiment of the present invention.

As shown in FIG. 6A, an electromagnetic wave shielding film 210 is made up of a protective layer 211, a shield layer 212 laminated on the protective layer 211, and an adhesive layer 213 laminated on the shield layer 212.

In addition, a plurality of conductive bumps 214 are formed on a side of the adhesive layer 213 of the shield layer 212.

An array of the conductive bumps 214 of the electromagnetic wave shielding film 210 will be described.

Figure 6B:
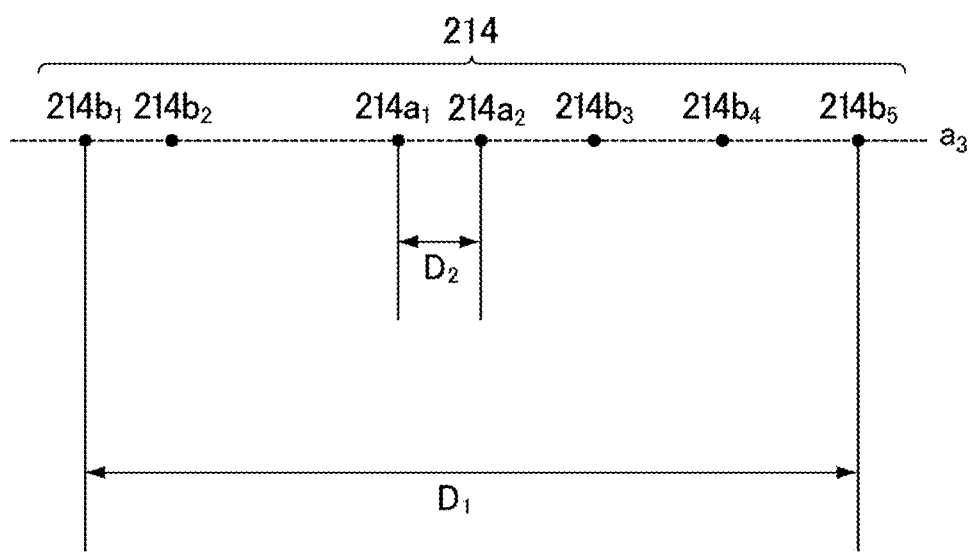
FIG. 6B is a plan view schematically showing an example of an array of conductive bumps in a plan view of a shield layer of the electromagnetic wave shielding film according to the second embodiment of the present invention from a side of an adhesive layer.

FIG. 6B is a plan view schematically showing an array of conductive bumps in a plan view of a shield layer of the electromagnetic wave shielding film shown in FIG. 6A from a side of an adhesive layer.

As shown in FIG. 6B, the conductive bumps 214 include a first conductive bump $214a_1$ and a second conductive bump $214a_2$ at a nearest position to the first conductive bump $214a_1$.

Furthermore, when a straight line $a_3$ passing through the first conductive bump $214a_1$ and the second conductive bump $214a_2$ is drawn, other conductive bumps including a conductive bump $214b_1$, a conductive bump $214b_2$, a conductive bump $214b_3$, a conductive bump $214b_4$, and a conductive bump $214b_5$ are arranged on the straight line $a_3$ outside of the first conductive bump $214a_1$ and the second conductive bump $214a_2$. An array sequence of the respective conductive bumps is a sequence of the conductive bump $214b_1$, the conductive bump $214b_2$, the first conductive bump $214a_1$, the second conductive bump $214a_2$, the conductive bump $214b_3$, the conductive bump $214b_4$, and the conductive bump $214b_5$.

While only the conductive bumps arrayed on the straight line $a_3$ are described in FIG. 6B for the sake of convenience, conductive bumps may be formed in the electromagnetic wave shielding film 210 other than on the straight line $a_3$.

In addition, when any two conductive bumps 214 are selected among the conductive bumps 214 arranged on the straight line $a_3$, when a distance in a case that maximizes a distance between the two selected conductive bumps 214 (a distance from the conductive bump $214b_1$ to the conductive bump $214b_5$ in FIG. 6B) is denoted by $D_1$ and a distance from the first conductive bump $214a_1$ to the second conductive bump $214a_2$ is denoted by $D_2$, the number of the conductive bumps 214 arranged on the straight line $a_3$ is less than $D_1/D_2+1$.

The electromagnetic wave shielding film having such features means that the conductive bumps 214 are not arrayed at regular intervals on the straight line $a_3$.

This point will be described in further detail with reference to the drawings.

Figure 7:
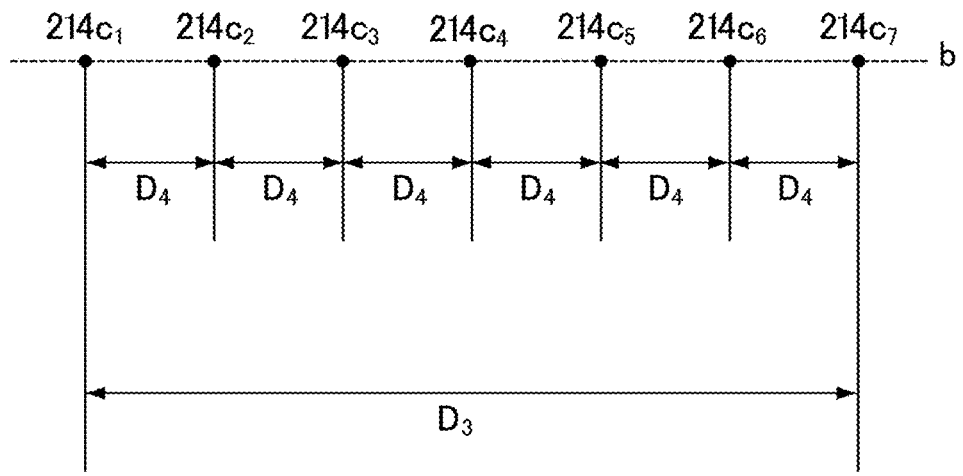
FIG. 7 is a plan view schematically showing an array of conductive bumps of an electromagnetic wave shielding film in which conductive bumps are linearly arrayed at regular intervals.

FIG. 7 is a plan view schematically showing an array of conductive bumps of an electromagnetic wave shielding film in which conductive bumps are linearly arrayed at regular intervals.

As shown in FIG. 7, let us consider a case where a total of seven conductive bumps from a conductive bump $214c_1$ to a conductive bump $214c_7$ are arranged at regular intervals on a straight line b.

When any two conductive bumps are selected from among the conductive bumps, a case where a distance between the selected conductive bumps is maximized is a case where the conductive bump $214c_1$ and the conductive bump $214c_7$ are selected.

In this case, when the distance from the conductive bump $214c_1$ to the conductive bump $214c_7$ is denoted by $D_3$ and a distance between the respective conductive bumps is denoted by $D_4$, an expression described as $D_4 \times$(total number of conductive bumps$-1$)$=D_4 \times 6 = D_3$ is satisfied.

The expression can be transformed to $D_3/D_4=6$ (total number of conductive bumps$-1$), which can be further transformed to $D_3/D_4+1=$total number of conductive bumps. In other words, this expression is satisfied when the conductive bumps are linearly arranged at regular intervals.

On the other hand, as shown in FIG. 6B, when the conductive bumps 214 are not arranged on the straight line $a_3$ at regular intervals, even a product calculated by multiplying the minimum distance $D_2$ between conductive bumps 14 on the straight line $a_3$ by (total number of conductive bumps$-1$) is less than the distance $D_1$. This can be expressed as $D_2 \times$(total number of conductive bumps$-1$)$<D_1$. The expression can be transformed to (total number of conductive bumps$-1$)$<D_1/D_2$, which can be further transformed to the total number of conductive bumps$<D_1/D_2+1$.

In other words, the conductive bumps 214 can be described as not being linearly arranged at regular intervals if the number of conductive bumps 214 is less than $D_1/D_2+1$.

Due to the electromagnetic wave shielding film 210 having such an array of conductive bumps (in other words, since the conductive bumps 214 are not linearly arrayed at regular intervals), parasitic circuits can be prevented from being created due to the conductive bumps 214 being positioned on a signal circuit of the printed wiring board when arranging the electromagnetic wave shielding film 210 on the printed wiring board and, consequently, transmission loss can be reduced.

Besides the arrangement of the conductive bumps described above, preferred materials and the like of the protective layer 211, the shield layer 212, the adhesive layer 213, and the conductive bumps 214 that constitute the electromagnetic wave shielding film 210 according to the second embodiment of the present invention are the same as the preferred materials and the like of the protective layer 11, the shield layer 12, the adhesive layer 13, and the conductive bumps 14 that constitute the electromagnetic wave shielding film 10 according to the first embodiment of the present invention described above.

REFERENCE SIGNS LIST 1 shielded printed wiring board
10, 210 electromagnetic wave shielding film
11, 211 protective layer
12, 212 shield layer
13, 213 adhesive layer
14, 14a, 14b, 14c, 14d, 14e, 14f, 14g, 114A, 114B, 114C, 114D, 114E, 114F, 214 conductive bump
20 printed wiring board
21 base film
22 printed circuit
22a ground circuit
23 coverlay
23a opening portion
$214a_1$ first conductive bump
$214a_2$ second conductive bump
$214b_1$, $214b_2$, $214b_3$, $214b_4$, $214b_4$ other conductive bumps
14', $214c_1$, $214c_2$, $214c_3$, $214c_4$, $214c_5$, $214c_6$, $214c_7$ conductive bumps linearly arrayed at regular intervals

The invention claimed is:

1. An electromagnetic wave shielding film, comprising:
a protective layer;
a shield layer laminated on the protective layer; and
an adhesive layer laminated on the shield layer,
a plurality of conductive bumps being formed on a side of the adhesive layer of the shield layer,
in a plan view of the shield layer from the side of the adhesive layer,
the conductive bumps being arranged so as to be positioned on a tessellation of two or more kinds of polygons at vertices of the respective polygons, and
the plurality of conductive bumps being arranged such that, with respect to each of the plurality of conductive bumps, when drawing line segments connecting the respective conductive bumps and nearest conductive bumps at a nearest position and drawing a straight line passing through one line segment among the drawn line segments, the straight line having a portion where the conductive bumps are not arrayed at regular intervals.

2. The electromagnetic wave shielding film according to claim 1,
wherein the polygons includes two kinds including an equilateral triangle and a square, and a length of one side of the equilateral triangle and a length of one side of the square are equal to each other.

3. The electromagnetic wave shielding film according to claim 1,
wherein the polygons are two kinds including a rhombus and a regular hexagon, and a length of one side of the rhombus and a length of one side of the regular hexagon are equal to each other.

4. The electromagnetic wave shielding film according to claim 1,
wherein the polygons are two kinds including an equilateral triangle and a regular hexagon, and a length of one side of the equilateral triangle and a length of one side of the regular hexagon are equal to each other.

5. The electromagnetic wave shielding film according to claim 1,
wherein the polygons are three kinds including an equilateral triangle, a square, and a regular hexagon, and a length of one side of the equilateral triangle, a length of one side of the square, and a length of one side of the regular hexagon are equal to each other.

6. The electromagnetic wave shielding film according to claim 1,
wherein the polygons are two kinds including an equilateral triangle and a regular dodecagon, and a length of one side of the equilateral triangle and a length of one side of the regular dodecagon are equal to each other.

7. The electromagnetic wave shielding film according to claim 1,
wherein the polygons are two kinds including a square and a regular octagon, and a length of one side of the square and a length of one side of the regular octagon are equal to each other.

8. The electromagnetic wave shielding film according to claim 1,
wherein the polygons are three kinds including a square, a regular hexagon, and a regular dodecagon, and a length of one side of the square, a length of one side of the regular hexagon, and a length of one side of the regular dodecagon are equal to each other.

9. An electromagnetic wave shielding film, comprising:
a protective layer;
a shield layer laminated on the protective layer; and
an adhesive layer laminated on the shield layer, a plurality of conductive bumps being formed on a side of the adhesive layer of the shield layer,
the plurality of conductive bumps including a first conductive bump and a second conductive bump at a position nearest to the first conductive bump,
in a plan view of the shield layer from the side of the adhesive layer, when a straight line "a" passing through the first conductive bump and the second conductive bump is drawn, others of the conductive bumps being arranged on the straight line "a" outside the first conductive bump and the second conductive bump, and
when any two conductive bumps are selected among the conductive bumps arranged on the straight line "a", when a distance in a case that maximizes a distance between the two selected conductive bumps is denoted by $D_1$ and a distance from the first conductive bump to the second conductive bump is denoted by $D_2$, the number of the conductive bumps arranged on the straight line "a" being less than $D_1/D_2+1$.

* * * * *